United States Patent
Bittner et al.

(10) Patent No.: US 10,061,206 B2
(45) Date of Patent: Aug. 28, 2018

(54) PROJECTION LENS WITH WAVE FRONT MANIPULATOR AND RELATED METHOD AND APPARATUS

(71) Applicant: Carl Zeiss SMT GmbH, Oberkochen (DE)

(72) Inventors: Boris Bittner, Roth (DE); Norbert Wabra, Werneck (DE); Sonja Schneider, Oberkochen (DE); Ricarda Schoemer, Zusmarshausen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/814,765

(22) Filed: Nov. 16, 2017

(65) Prior Publication Data

US 2018/0081281 A1   Mar. 22, 2018

Related U.S. Application Data

(63) Continuation of application No. PCT/EP2016/060398, filed on May 10, 2016.

(30) Foreign Application Priority Data

May 18, 2015   (DE) .................. 10 2015 209 051

(51) Int. Cl.
  *G03B 27/68* (2006.01)
  *G03F 7/20* (2006.01)
  (Continued)

(52) U.S. Cl.
  CPC ....... *G03F 7/70266* (2013.01); *G02B 13/143* (2013.01); *G02B 27/0068* (2013.01); *G03F 7/70308* (2013.01)

(58) Field of Classification Search
  CPC .............. G02B 13/143; G02B 27/0068; G03F 7/70266; G03F 7/70308
  See application file for complete search history.

(56) References Cited

U.S. PATENT DOCUMENTS 4,965,630 A * 10/1990 Kato ................... G03F 7/70241
                                                         355/52
6,104,472 A *  8/2000 Suzuki ................ G03F 7/70258
                                                         355/53

(Continued)

FOREIGN PATENT DOCUMENTS

DE        102 58 718 A1    6/2004
DE   10 2012 205 096 B3    8/2013

(Continued)

OTHER PUBLICATIONS

German Office Action, with translation thereof, for corresponding Appl No. 10 2015 209 051.5, dated Jan. 20, 2016.

(Continued)

*Primary Examiner* — Deoram Persaud
(74) *Attorney, Agent, or Firm* — Fish & Richardson P.C.

(57) ABSTRACT

A projection lens images a pattern of a mask arranged in the region of an object plane of the projection lens into an image plane of the projection lens via electromagnetic radiation with a work wavelength $\lambda < 260$ nm. The projection lens has a multiplicity of optical elements with optical surfaces. The projection lens also has a wavefront manipulation system for controllable influencing of the wavefront of the projection radiation travelling from the object plane to the image plane. The wavefront manipulation system has a manipulator having a manipulator element and an actuating device or reversibly changing an optical effect of the manipulator element on radiation of the projection beam path.

18 Claims, 6 Drawing Sheets

(51) Int. Cl.
*G02B 13/14* (2006.01)
*G02B 27/00* (2006.01)

(56) References Cited

U.S. PATENT DOCUMENTS

| | | | |
|---|---|---|---|
| 6,333,776 B1* | 12/2001 | Taniguchi | G03F 7/70091 355/52 |
| 6,416,913 B1* | 7/2002 | Suzuki | G03F 7/70258 430/30 |
| 7,310,187 B2 | 12/2007 | Epple et al. | |
| 7,830,611 B2* | 11/2010 | Conradi | G02B 3/14 359/649 |
| 7,990,622 B2 | 8/2011 | Conradi et al. | |
| 9,170,497 B2 | 10/2015 | Bittner et al. | |
| 9,651,872 B2* | 5/2017 | Feldmann | G03F 7/70266 |
| 9,823,578 B2* | 11/2017 | Rist | G03F 7/70258 |
| 9,910,364 B2* | 3/2018 | Bittner | G03F 7/7015 |
| 9,927,714 B2* | 3/2018 | Bittner | G03F 7/70266 |
| 2002/0012109 A1* | 1/2002 | Suzuki | G03F 7/701 355/53 |
| 2003/0035090 A1* | 2/2003 | Imai | G03B 27/42 355/53 |
| 2003/0071986 A1* | 4/2003 | Geh | G01M 11/0207 356/124 |
| 2004/0109237 A1 | 6/2004 | Epple et al. | |
| 2004/0257549 A1 | 12/2004 | Leenders et al. | |
| 2005/0190350 A1* | 9/2005 | Shinoda | G03F 7/70108 355/53 |
| 2007/0165202 A1 | 7/2007 | Koehler et al. | |
| 2007/0018881 A1 | 8/2007 | Epple et al. | |
| 2008/0316447 A1* | 12/2008 | Yabu | G03B 27/42 355/53 |
| 2009/0153828 A1* | 6/2009 | Yabu | G03B 27/54 355/67 |
| 2009/0174876 A1* | 7/2009 | Schriever | G03F 7/70041 355/69 |
| 2010/0020302 A1* | 1/2010 | Freimann | G03F 7/70133 355/68 |
| 2010/0321661 A1* | 12/2010 | Natt | G03F 7/70091 355/67 |
| 2011/0181855 A1* | 7/2011 | Bittner | G03F 7/70266 355/55 |
| 2012/0002184 A1* | 1/2012 | Bader | G03F 7/70108 355/67 |
| 2013/0188246 A1 | 7/2013 | Rogalsky et al. | |
| 2013/0258302 A1* | 10/2013 | Bittner | G03F 7/70258 355/67 |
| 2014/0104587 A1* | 4/2014 | Freimann | G03F 7/70266 355/67 |
| 2014/0268084 A1* | 9/2014 | Feldmann | G03F 7/70266 355/67 |
| 2014/0340664 A1* | 11/2014 | Bleidistel | G03F 7/70141 355/67 |
| 2015/0070677 A1 | 3/2015 | Epple | |
| 2016/0033873 A1 | 2/2016 | Bittner et al. | |
| 2016/0161845 A1* | 6/2016 | Bittner | G03F 7/70258 716/52 |
| 2017/0261730 A9* | 9/2017 | Bittner | G02B 17/0896 |

FOREIGN PATENT DOCUMENTS

| | | |
|---|---|---|
| WO | WO 2005/026843 A2 | 3/2005 |
| WO | WO 2014/139719 A1 | 9/2014 |

OTHER PUBLICATIONS

International Search Report and Written Opinion for corresponding PCT Appl No. PCT/EP2016/060398, dated Aug. 26, 2016. (13 pages).

* cited by examiner

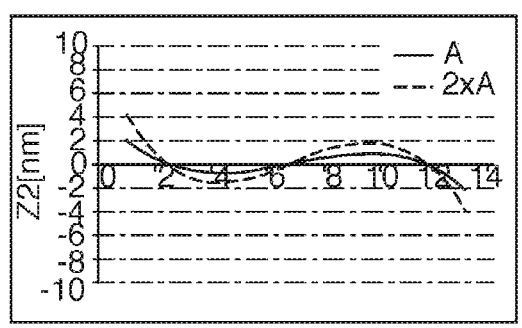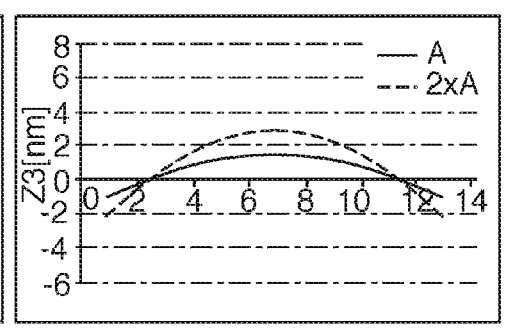
Fig. 6A  Fig. 6B
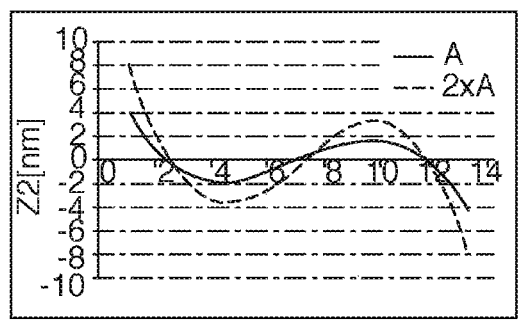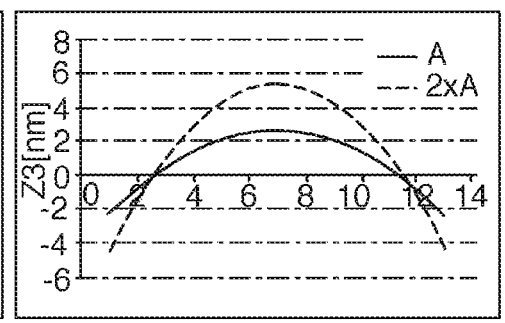
Fig. 7A  Fig. 7B

| SW = 1μm | | | | | | ... |
|---|---|---|---|---|---|---|
| FP | | Z2 | Z3 | Z4 | Z5 | ... |
| X | Y | | | | | |
| $X_1$ | $Y_1$ | $Z2_{11}$ | $Z3_{11}$ | | | ... |
| $X_1$ | $Y_2$ | $Z2_{12}$ | | | | ... |
| ⋮ | ⋮ | ⋮ | | | | ... |
| $X_2$ | $Y_1$ | $Z2_{21}$ | | $Z4_{21}$ | | ... |
| $X_2$ | $Y_2$ | $Z2_{22}$ | | | | ... |
| ⋮ | ⋮ | ⋮ | | | | ... |
| | | | | | | ... |

Fig. 8

TAB

PROJECTION LENS WITH WAVE FRONT MANIPULATOR AND RELATED METHOD AND APPARATUS

CROSS-REFERENCE TO RELATED APPLICATIONS

The present application is a continuation of, and claims benefit under 35 USC 120 to, international application PCT/EP2016/060398, filed May 10, 2016, which claims benefit under 35 USC 119 of German Application No. 10 2015 209 051.5, filed May 18, 2015. The entire disclosure of these applications are incorporated by reference herein.

FIELD

The disclosure relates to a projection lens for imaging a pattern of a mask arranged in the region of an object plane of the projection lens into an image plane of the projection lens via electromagnetic radiation with a work wavelength $\lambda<260$ nm, and to a projection exposure apparatus and a projection exposure method which can be performed with the aid of the projection lens or the projection exposure apparatus.

BACKGROUND

These days, it is predominantly microlithographic projection exposure methods that are used for producing semiconductor components and other finely structured components, such as e.g. photolithography masks. Here, use is made of masks (reticles) or other pattern generating devices, which carry or form the pattern of a structure to be imaged, e.g. a line pattern of a layer of a semiconductor component. The pattern is positioned in the region of the object plane of the projection lens between an illumination system and a projection lens in a projection exposure apparatus and it is illuminated by illumination radiation provided by the illumination system. The radiation modified by the pattern travels through the projection lens as projection radiation, the projection lens imaging the pattern with a reduced scale onto the substrate to be exposed. The surface of the substrate is arranged in the image plane of the projection lens optically conjugate to the object plane. The substrate is generally coated by a radiation-sensitive layer (resist, photoresist).

It is desirable to generate structures with increasingly smaller dimensions on the substrate by way of lithography. In the case of e.g. semiconductor components, smaller structures can lead to higher integration densities; this generally can have an expedient effect on the capability of the microstructured components produced.

The size of the generable structures depends decisively on the resolving power of the employed projection lens and can be increased, firstly, by reducing the wavelength of the projection radiation used for the projection and, secondly, by increasing the image-side numerical aperture NA of the projection lens used in the process.

These days, highly resolving projection lenses operate at wavelengths of less than 260 nm in the deep ultraviolet (DUV) range or in the extreme ultraviolet (EUV) range.

In order to ensure a sufficient correction of aberrations (e.g. chromatic aberrations, image field curvature) in the case of wavelengths in the deep ultraviolet (DUV) range, use is usually made of catadioptric projection lenses which have both transparent refractive optical elements with refractive power (lens elements) and reflective elements with refractive power, i.e. curved mirrors. Typically, at least one concave mirror is contained. In this case, a resolving power enabling a projection of structures with dimensions of 40 nm is obtained these days with immersion lithography at NA=1.35 and $\lambda=193$ nm.

Integrated circuits are produced by a sequence of photolithographic structuring steps (exposures) and subsequent processing steps, such as etching and doping, of the substrate. The individual exposures are usually performed using different masks or different patterns. So that the completed circuit exhibits the desired function, it is desirable for the individual photolithographic exposure steps to be matched to one another to the best possible extent such that the manufactured structures, e.g. contacts, lines and the components of diodes, transistors and other electrically functional units, come as close as possible to the ideal of the planned circuit layout.

Manufacturing errors may arise, inter alia, when the structures generated in successive exposure steps do not lie sufficiently closely on one another, i.e. if the overlay accuracy is insufficient. The overlay accuracy of structures from different manufacturing steps of a photolithographic process is usually referred to by the term "overlay". This term denotes, for example, the overlay accuracy of two successive lithographic planes. The overlay is an important parameter when manufacturing integrated circuits because alignment errors of any type can cause manufacturing errors, such as short circuits or missing connections, and thus restrict the functionality of the circuit.

High demands are also placed on the overlay accuracy of successive exposures in multiple exposure methods. By way of example, a substrate, for example a semiconductor wafer, is exposed twice in succession in the double patterning method (or double exposure method) and the photoresist is processed further thereafter. By way of example, a normal structure with a suitable structure width is projected in a first exposure process. A second mask with a different mask structure is used for a second exposure process. By way of example, periodic structures of the second mask can be displaced by half a period in relation to periodic structures of the first mask. In the general case, the differences between the layouts of the two masks can be large, particularly in the case of more complex structures. Double patterning can achieve a reduction in the period of periodic structures on the substrate. This can only succeed if the overlay accuracy of the successive exposures is sufficiently good; i.e., if the overlay errors do not exceed a critical value.

An insufficient overlay can therefore significantly reduce the yield of good parts during the manufacturing, as a result of which the manufacturing costs per good part increase. WO 2014/139719 A1 describes a projection lens with a wavefront manipulation system for controllable influence of the wavefront of the projection radiation travelling from the object plane to the image plane of the projection lens. The wavefront manipulation system has a manipulator having a manipulator surface arranged in the projection beam path. It is arranged in a near-field manner, i.e. at a small distance from the closest field plane, for example between the object plane and a first subsequent lens. The manipulator includes an actuating device which renders it possible to modify the surface form and/or the refractive index distribution of the manipulator surface in a reversible manner. The manipulator is configured in such a way that a plurality of maxima and a plurality of minima of an optical path length change of the projection radiation can be generated in accordance with a characteristic period over an optically used region of the manipulator surface. As a result of this, it is possible, inter alia, to keep overlay errors small or to reduce the latter.

SUMMARY

The disclosure seeks to provide a projection lens, a projection exposure apparatus and a projection exposure method for microlithography, which render it possible to carry out different photolithographic processes under different operating conditions with small overlay errors. In particular, possible changes in the position of the mask should be able to be taken into account within the scope of the control thereof.

In an aspect, the disclosure provides a projection lens for imaging a pattern of a mask arranged in the region of an object plane of the projection lens into an image plane f the projection lens via electromagnetic radiation with a work wavelength $\lambda<260$ nm. The projection lens includes: a multiplicity of optical elements with optical surfaces which are arranged in a projection beam path between the object plane and the image plane in such a way that a pattern arranged in the object plane is imageable in the image plane via the optical elements; and a wavefront manipulation system for controllable influencing of the wavefront of the projection radiation travelling from the object plane to the image plane. The wavefront manipulation system has a manipulator which has a manipulator element arranged in the projection beam path and an actuating device for reversibly changing an optical effect of the manipulator element on radiation of the projection beam path. A manipulator surface of the manipulator element is arranged at a finite distance from a closest field plane of the projection lens in the optical vicinity of this field plane in such a way that locally different optical effects of the manipulator element are adjustable via the actuating device for beams emanating from different field points of the field plane. A sensitivity adaptation system for adapting a sensitivity of the manipulator to changes of imaging properties by displacing the mask in relation to the object plane and/or by deforming the mask.

In an aspect, the disclosure provides a projection exposure method for exposing a radiation-sensitive substrate with at least one image of a pattern of a mask. The method includes the following steps: holding the mask between an illumination system and a projection lens of a projection exposure apparatus in such a way that the pattern is arranged in the region of the object plane of the projection lens; holding the substrate in such a way that a radiation-sensitive surface of the substrate is arranged in the region of an image plane of the projection lens optically conjugate to the object plane; illuminating an illumination region of the mask with illumination radiation provided by the illumination system having a work wavelength $\lambda<260$ nm; projecting part of the pattern lying in the illumination region onto an image field on the substrate with the aid of the projection lens, wherein all rays of the projection radiation contributing to the image generation in the image field form a projection beam path; and influencing the wavefront of the projection radiation travelling from the object plane to the image plane by actuating a manipulator which has a manipulator surface arranged in the projection beam path and an actuating device for reversibly changing surface form and/or refractive index distribution of the manipulator surface. The manipulator surface of the manipulator element is arranged at a finite distance from a closest field plane of the projection lens in the optical vicinity of this field plane in such a way that locally different optical effects of the manipulator element are adjustable via the actuating device for beams emanating from different field points of the field plane. The method also includes: displacing the mask in relation to the object plane and/or deforming the mask; and adapting the sensitivity of the manipulator to changes of imaging properties caused by displacing the mask in relation to the object plane and/or by deforming the mask.

In an aspect, the disclosure provides a projection exposure apparatus for exposing a radiation-sensitive substrate arranged in the region of an image area of a projection lens with at least one image of a pattern of a mask arranged in the region of an object surface of the projection lens. The projection exposure apparatus includes: a light source for emitting ultraviolet light with a work wavelength $\lambda<260$ nm; an illumination system for receiving the light of the light source and for forming illumination radiation directed to the pattern of the mask; a projection lens for imaging the structure of the mask onto a light-sensitive substrate; a device for holding the mask between the illumination system and the projection lens in such a way that the pattern is arranged in the region of the object plane of the projection lens; and a device for holding the substrate in such a way that a radiation-sensitive surface of the substrate is arranged in the region of an image plane of the projection lens optically conjugate to the object plane. The projection lens is embodied as described herein.

The projection lens has a wavefront manipulation system for controllable influence of the wavefront of the projection radiation travelling from the object plane to the image plane of the projection lens. The effect of the components of the wavefront manipulation system arranged in the projection beam path can be adjusted in a variable manner depending on control signals of a control device, as a result of which the wavefront of the projection radiation can be modified in a targeted manner. The optical effect of the wavefront manipulation system can be modified in the case of e.g. specific, predefined occasions or in a manner dependent on the situation prior to an exposure, or else during an exposure. The wavefront manipulation system has a manipulator having (at least) one manipulator surface arranged in the projection beam path. The manipulator includes an actuating device which renders it possible to modify the surface form and/or the refractive index distribution of the manipulator surface in a reversible manner. As a result of this, it is possible to modify, in a targeted manner, the wavefront of the projection radiation influenced by the manipulator surface. This change in the optical effect is possible without exchanging the manipulator with another manipulator.

The manipulator (or the actuating device of a manipulator) contains one or more actuating members or actuators, the current manipulated value of which can be modified or adjusted on the basis of control signals from the operating control system. If a manipulated value change is a movement of an actuator, for example in order to shift or tilt or deform a manipulator element, a manipulated value change can also be referred to as actuator travel. By way of example, a manipulated value change can also be present as a temperature change or change in an electric voltage.

A manipulator surface is understood to mean a plane or curved surface (i) which is arranged in the projection beam path and (ii) in which a change in the surface form and/or the orientation thereof in relation to the projection radiation leads to a change in the wavefront of the projection radiation. By way of example, any curved surface of a lens element displaceable relative to the other optical components of a projection lens can be considered to be a manipulator surface. Further examples include mechanically or thermally deformable surfaces of lens elements or mirrors. In the case of a local, thermal manipulation of a lens element, the refractive index of the lens element will generally also vary locally in space. If the assumption can be made—for example due to the thickness of the lens element—that this variation does not have a component in the direction of the projection radiation, i.e. the refractive index only varies orthogonal to the direction of the projection radiation, it is expedient also to consider a local variation of the refractive index of a lens element as an effect occurring at a manipulator surface. By way of example, this applies to thin plane plates.

The manipulator surface is arranged "in the optical vicinity" of a closest field plane of the projection lens. This "near-field arrangement" means, inter alia, that the manipulator surface is arranged substantially closer to the closest field plane than to a pupil plane of the projection lens. Here, each beam emanating from a field point of the field plane illuminates a subaperture with a subaperture diameter SAD at the manipulator surface, the subaperture diameter being substantially smaller than the maximum diameter $D_{FP}$ of the optically used region of the manipulator surface such that different wavefront changes can be obtained for different field points.

In order to generate an optical effect of the manipulator with a variation over the image field, a ratio $SAD/D_{FP}$ of 0.5 or less should be present at the manipulator element. In the case of larger values, it is hardly possible, in general, to adjust a relevant field variation of an aberration. Preferably, the condition $SAD/D_{FP}<0.2$ should apply. In particular, even the condition $SAD/D_{FP}<0.1$ can apply. Here, the subaperture diameter SAD should be understood to mean the diameter of the beam of projection light emanating from a single field point. The quotient $SAD/D_{FP}$ is generally independent of the level of the observed field point.

The inventors have determined that the effect of a manipulator on the wavefront may depend sensitively on the relative position of the mask carrying the pattern in relation to the object plane of the projection lens if a manipulator surface of the manipulator is arranged optically very close to a field plane. In particular, there can be a relatively strong relative change of the subaperture dimensions or subaperture diameters of the beams emanating from the different field points at the manipulator surface if the mask is displaced in respect of the setpoint position thereof in the region of the object plane by way of an axial shift and/or tilt, and/or if the mask is deformed by forces acting thereon.

What was furthermore identified is that a clear relative change in the subaperture dimensions or subaperture diameters at a manipulator surface arranged in a near-field manner may lead to a significant change in the so-called "sensitivity" of the manipulator. In this application, the term sensitivity describes the relation between a defined manipulated value change at a manipulator and the effect, obtained thereby, on the imaging quality or on lithographic errors.

The manipulated value changes at manipulators or at actuators of manipulators for a desired intervention in the system are, proceeding from a control program, established in some operating control systems by a correction algorithm which optimizes a target function (merit function). What this should achieve, inter alia, is that there is not a minimization of an individual residual aberration to the detriment of others, but that an expedient, balanced reduction in all relevant influencing variables to tolerable values is achieved.

Taking into account the sensitivities, admissible manipulated value changes of a manipulator can be restricted to magnitudes below a manipulated value limit value by a control-technical approach. The admitted manipulated value range is sometimes referred to as "range" of a manipulator. It may be expedient to define the admitted manipulated value range or range in such a way that the manipulator exhibits a linear behaviour in a way that there is, at least approximately, proportionality between the magnitude of the manipulated value and the size of the wavefront change caused thereby within the admitted manipulated value range.

In many cases, it was found to be practical to operate under the assumption that the optical effect of two or more manipulator movements equals the sum of the optical effects of each individual manipulator movement (linearity hypothesis). It was identified that this linearity hypothesis may, under certain circumstances, no longer be valid over the whole range in the case of a particularly field-near position of the manipulator surface (and the option connected therewith of a relatively strong change in the subaperture dimensions). If these aspects are not taken into account, it may be the case that the operating control system cannot establish the optimum manipulated value changes under certain operating conditions. The operating conditions desired in this respect include, in particular, changes of imaging properties which are caused by a displacement of the mask in relation to the object plane and/or by a deformation of the mask.

In accordance with one aspect of the disclosure, a sensitivity adaptation system is provided for adapting the sensitivity of the manipulator to changes of imaging properties by displacing the mask in relation to the object plane and/or by deforming the mask. As a result, the projection exposure apparatus is able to react independently to the aforementioned desired conditions and can provide an imaging quality specified for the process even under desired conditions.

One option for adjusting or adapting sensitivities within the scope of a sensitivity adaptation system consists of modifying, in a targeted manner, the position of the manipulator element as a reaction to the aforementioned changes of imaging properties. In one embodiment, the manipulator element is movably borne via a bearing device and it can be displaced, in a manner dependent on control signals of an operating control system, from a first position to a second position, differing therefrom, in relation to the closest field plane via a position changing device. As a result of this, it is possible to restrict and possibly minimize parasitic effects, which may be caused, for example, by changes in the position of the reticle and/or in the form of the reticle. A displacement of the reticle can lead to a strong relative change in the subaperture dimensions of the manipulator element, as a result of which the sensitivity of the manipulator can change in such a way that the linearity hypothesis can no longer be considered to be valid over the whole range. Accordingly, e.g. the second position can be selected in such a way that the assumption that the optical effect correlates substantially linearly with the extent of manipulated variable changes can be assumed once again with a sufficient amount of accuracy for the manipulator with the manipulator element situated in the second position. As a result of this, a more precise wavefront correction is possible than in the case of a lacking adaptation to modified imaging conditions.

A change in the position can relate to any rigid body degree of freedom of the manipulator element. The change in the position of the manipulator element can include e.g. a global displacement in the direction of an optical axis of the projection lens in the region of the manipulator element and/or a tilt in relation to a tilt axis aligned perpendicular to this optical axis and/or a displacement perpendicular to the optical axis.

In one exemplary embodiment, the projection lens has an optical axis and the manipulator element is shiftable parallel to the optical axis in the region of the manipulator element via the position changing device. In the case of such a shift, the change in the distance between the closest field plane and the manipulator element generally has the same magnitude for all field points. Alternatively or additionally, provision can be made for the position changing device to be configured in such a way that the manipulator element is tiltable about a tilt axis which extends across the optical axis in the region of the manipulator element via the position changing device. Different changes in the distance from the closest field plane may emerge for different field points in the case of such a tilt. There may be an increase in the associated subaperture dimensions for some field points and, at the same time, a reduction therein for other field points.

In accordance with another aspect of the disclosure, provision is made for a generic projection lens, in which a manipulator element arranged in a near-field manner (in the optical vicinity of the closest field plane) is movably borne via a bearing device and displaceable, in a manner dependent on control signals of an operating control system, from a first position to a second position in relation to the closest field plane via a position changing device. This embodiment can be advantageous, also independently of the existence of a sensitivity adaptation system.

It was found to be advantageous if the position changing device is embodied in such a way that a change in the distance to the closest field plane—given by e.g. the distance between the first and second position—of at least 10 μm is adjustable for at least one field point. As a result of this, it is possible to often achieve changes in the sensitivities usable for correction purposes. In general, it is advantageous if the change in the distance lies in the range from 10 μm to 100 μm. The accuracy of the position measurement and the adjustment accuracy of the manipulator can have a restrictive effect in the case of distance changes significantly below the lower boundary, which, in principle, are possible. Distance changes significantly above the upper boundary may involve a more complex mechanical structure of the components provided for displacing the manipulator element if a large change in distance should be obtained with, at the same time, a high positioning accuracy. In general, a good compromise between outlay and use is obtainable in the preferred range.

In some embodiments, the field plane lying next to the manipulator element (the closest field plane) is the object plane of the projection lens. Here, the arrangement can be selected in such a way that no optical surface with refractive power is arranged between the object plane and the manipulator surface such that the numerical aperture $NA_M$ of the projection radiation at the manipulator surface equals the object-side numerical aperture $NA_O$ of the projection lens. As a result of this, a particularly precise, field-dependent adjustment of the desired manipulator effect is possible.

To the extent that an intermediate image plane exists within the projection lens between the object plane and the image plane, in the region of which intermediate image plane a real intermediate image is generated, the closest field plane can also be this intermediate plane of the projection lens. In this case, the correction state of the real intermediate image should be taken into account when designing manipulator movements and when determining the sensitivities.

Often, it is desirable for it to be possible to adjust the effect of the manipulator element independently of adjacent field points for as many field points of the field plane as possible. In particular, an advantageously small distance from the closest field plane can be obtained if at least one of the following conditions holds true for a position of the manipulator surface in the projection beam path: (i) each beam emanating from a field point of the field plane illuminates a subaperture with a subaperture diameter SAD at the manipulator surface, wherein the condition $SAD/D_{FP}<0.2$ applies at the manipulator surface, where $D_{FP}$ is a maximum value of an optically used diameter of the manipulator surface; (ii) the distance between the manipulator surface and the closest field plane is 30 mm or less; and (iii) the condition $SAR<0.1$ applies for a subaperture ratio SAR at the manipulator surface.

The subaperture ratio SAR is used in one of the conditions above for the purposes of quantifying the position of an optical element or an optical surface in the beam path. In accordance with an elucidating definition, the subaperture ratio SAR of an optical surface of an optical element in the projection beam path is defined as the quotient between the subaperture diameter SAD and the optical free diameter DCA in accordance with SAR:=SAD/DCA. The subaperture diameter SAD is given by the maximum diameter of a portion of the optical element illuminated by the rays of a beam emanating from a given field point. The optically free diameter DCA is the diameter of the smallest circle about a reference axis of the optical element, wherein the circle includes that region of the surface of the optical element which is illuminated by all rays coming from the object field.

Accordingly SAR=0 applies in a field plane (object plane or image plane or intermediate image plane). SAR=1 applies in a pupil plane. Therefore, "near-field" surfaces have a subaperture ratio lying close to 0, while "near-pupil" surfaces have a subaperture ratio lying close to 1.

The optical closeness or the optical distance of an optical surface from a reference plane (e.g. a field plane or a pupil plane) can be described by the so-called subaperture ratio SAR. For the purposes of this application, the subaperture ratio SAR of an optical surface is defined as follows:

$$SAR=\text{sign } CRH(MRH/(|CRH|+|MRH|))$$

where MRH denotes the marginal ray height, CRH denotes the chief ray height and the sign function sign x denotes the sign of x, with sign 0=1 according to convention. The chief ray height is understood to mean the beam height of the chief ray of a field point of the object field with a maximum field height in terms of magnitude. Here, the ray height should be understood to be signed. The marginal ray height is understood to mean the ray height of a ray with a maximum aperture proceeding from the point of intersection between the optical axis and the object plane. This field point need not contribute to transferring the pattern arranged in the object plane—in particular in the case of off-axis image fields.

The subaperture ratio is a signed variable which is a measure for the closeness to a field or pupil plane in the beam path. By definition, the subaperture ratio is normalized to values between −1 and +1, wherein the subaperture ratio is zero in each field plane and wherein the subaperture ratio jumps from −1 to +1, or vice versa, in a pupil plane. Therefore, a subaperture ratio with an absolute value of 1 determines a pupil plane.

Therefore, near-field planes have subaperture ratios lying close to 0, while near-pupil planes have subaperture ratios lying close to 1 in terms of magnitude. The sign of the subaperture ratio specifies the position of the plane upstream or downstream of a reference plane.

A further approach for realizing a sensitivity adaptation system consists of assigning different sensitivities to a manipulator, with it being possible to select among these sensitivities in a targeted manner depending on the operating conditions. This measure can be provided in addition to the option of changing a position of the manipulator element. However, it is also possible to achieve an adaptation of the sensitivity to changed imaging properties in this manner even in cases in which a change in position of the manipulator element is not possible for structural reasons or in which this is possible but unwanted.

An exemplary embodiment is characterized in that (i) an operating control system is assigned to the projection lens, which operating control system is configured in such a way that the manipulator is controlled on the basis of a control algorithm; (ii) a sensitivity series with two or more different sensitivities of the manipulator for different, mutually adjoining manipulated value ranges defined by thresholds (or limit values) is stored in a storage of the operating control system, wherein a sensitivity describes a relationship between a defined manipulated value change at the manipulator and the effect, obtained thereby, on the imaging property of the projection lens within a defined manipulated value range; and (iii) the operating control system is configured in such a way that, if a threshold within the sensitivity series is overshot or undershot, a switch is made from a first sensitivity to a second sensitivity differing therefrom and the control algorithm is modified thereby.

As a result of this configuration it is possible to take into account two or more different sensitivities when establishing the control algorithm when actuating the manipulator in a manner dependent on operating conditions.

In one embodiment, the position of the mask and/or a deformation state of the mask and/or the position of the manipulator is established and the sensitivity of the manipulator is selected automatically in a manner dependent on the position established thus and/or the deformation state of the mask established thus and/or the established position of the manipulator.

The disclosure also relates to a projection exposure apparatus, which has a projection lens of the types described and claimed here and/or which is configured to carry out the projection exposure method.

BRIEF DESCRIPTION OF THE DRAWINGS

Further advantages and aspects of the disclosure emerge from the claims and the subsequent description of preferred exemplary embodiments of the disclosure, which are explained below on the basis of the figures, in which:

FIGS. 6A-6B shows effects of a manipulator on selected aberrations for two different travels in the case of a distance of 3 mm from the closest field plane;

FIGS. 7A-7B shows effects of the manipulator from FIGS. 6A-6B on the same aberrations for the two different travels in the case of a distance of 6 mm from the closest field plane;

FIG. 8 shows a schematic illustration of an example of a sensitivity table; and

DETAILED DESCRIPTION OF THE EXEMPLARY EMBODIMENTS

Figure 1:
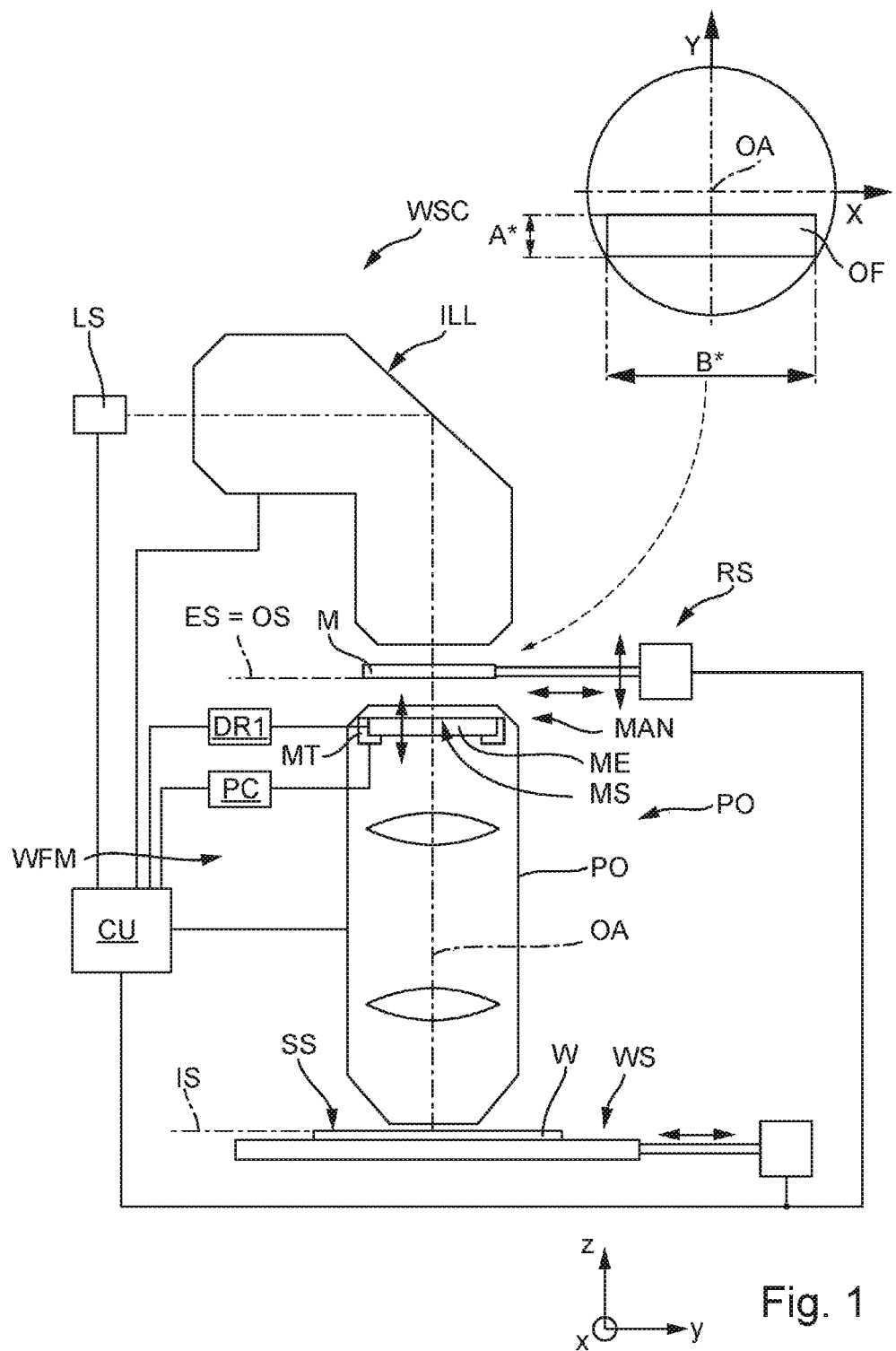
FIG. 1 shows a schematic illustration of a microlithographic projection exposure apparatus in accordance with one embodiment of the disclosure.

FIG. 1 shows an example of a microlithographic projection exposure apparatus WSC, which is employable in the production of semiconductor devices and other finely structured components and which operates with light or electromagnetic radiation from the deep ultraviolet (DUV) range in order to obtain resolutions down to fractions of micrometres. An ArF excimer laser with a work wavelength $\lambda$ of approximately 193 nm serves as primary radiation source or light source LS. Other UV laser light sources, e.g. $F_2$ lasers with a work wavelength of 157 nm or ArF excimer lasers with a work wavelength of 248 nm, are also possible.

On the emergence surface ES thereof, an illumination system ILL disposed downstream of the light source LS generates a large, sharply delimited and substantially homogeneously illuminated illumination field, which is adapted to the desired properties relating to telecentricity of the projection lens PO arranged therebehind in the light path. The illumination system ILL has devices for adjusting different illumination modes (illumination settings) and it can be switched e.g. between conventional on-axis illumination with different degrees of coherence $\sigma$ and off-axis illumination. By way of example, the off-axis illumination modes include an annular illumination or a dipole illumination or a quadrupole illumination or any other multi-polar illumination. The design of suitable illumination systems is known per se and therefore not explained in any more detail here. The patent application US 2007/0165202 A1 (corresponding to WO 2005/026843 A2) shows examples of illumination systems which can be used within the scope of various embodiments. In this respect, the disclosure of this patent application is made to be the content of this description by reference.

The optical components which receive the light from the light source LS and form illumination radiation from this light, which illumination radiation is directed to the illumination field lying in the emergence plane ES or to the reticle M, are part of the illumination system ILL of the projection exposure apparatus.

Arranged downstream of the illumination system is a device RS for holding and manipulating the mask M (reticle) in such a way that the pattern PAT arranged at the reticle lies in the region of the object plane OS of the projection lens PO, which coincides with the emergence plane ES of the illumination system and which is also referred to here as reticle plane OS. For the purposes of a scanning operation, the mask is movable parallel to this plane in a scanning direction (y-direction) perpendicular to the optical axis OA (z-direction) with the aid of a scanner drive.

The device RS includes an integrated lifting device for linearly displacing the mask in relation to the object plane in the z-direction, i.e. perpendicular to the object plane, and an integrated tilting device for tilting the mask about a tilt axis extending in the x-direction.

Following downstream of the reticle plane OS is the projection lens PO, which acts as a reduction lens and images an image of the pattern arranged at the mask M with a reduced scale, for example with the scale of 1:4 ($|\beta|=0.25$) or 1:5 ($|\beta|=0.20$), onto a substrate W coated with a photoresist layer, the light-sensitive substrate surface SS of which lies in the region of the image plane IS of the projection lens PO.

The substrate to be exposed, which is a semiconductor wafer W in the exemplary case, is held by a device WS which includes a scanner drive in order to move the wafer synchronously with the reticle M perpendicular to the optical axis OA in a scan direction (y-direction). The device WS furthermore includes a lifting device for linearly displacing the substrate in relation to the image plane in the z-direction and a tilting device for tilting the substrate about a tilt axis extending in the x-direction.

The device WS, which is also referred to as "wafer stage", and the device RS, which is also referred to as "reticle stage", are constituents of a scanner device which is controlled by way of a scan control device which, in the embodiment, is integrated in the central control device CU of the projection exposure apparatus.

The illumination field generated by the illumination system ILL defines the effective object field OF used during the projection exposure. In the exemplary case, the object field is rectangular, it has a height A* measured parallel to the scanning direction (y-direction) and it has a width B*>A* measured perpendicular thereto (in the x-direction). In general, the aspect ratio AR=B*/A* lies between 2 and 10, in particular between 3 and 6. The effective object field lies at a distance next to the optical axis in the y-direction (off-axis field). The effective image field on the image surface IS, which is optically conjugate to the effective object field, likewise is an off-axis field and it has the same form and the same aspect ratio between the height B and width A as the effective object field, but the absolute field dimension is reduced by the imaging scale $\beta$ of the projection lens, i.e. A=$|\beta|$A* and B=$|\beta|$B*.

If the projection lens is designed and operated as an immersion lens, a thin layer of an immersion liquid is transilluminated during the operation of the projection lens, which thin layer is situated between the emergence surface of the projection lens and the image plane IS. Image-side numerical apertures NA>1 are possible during the immersion operation. A configuration as a dry lens is also possible; in this case, the image-side numerical aperture is restricted to values NA<1. Under these conditions which are typical for high-resolution projection lenses, projection radiation with a relatively large numerical aperture, e.g. with values greater than 0.15 or greater than 0.2 or greater than 0.3, is present in the region of some or all field planes (object plane, image plane, possibly one or more intermediate image planes) of the projection lens.

The projection exposure apparatus WSC has an operating control system which is configured to undertake a timely fine optimization of imaging-relevant properties of the projection exposure apparatus as a reaction to environmental influences and other disturbances and/or on the basis of stored control data. To this end, the operating control system has a multiplicity of manipulators which permit a targeted intervention into the projection behaviour of the projection exposure apparatus. An actively actuatable manipulator contains one or more actuating members (or one or more actuators), the current manipulated value of which can be modified on the basis of control signals of the operating control system by virtue of defined manipulated value changes being undertaken.

The projection lens or the projection exposure apparatus is equipped with, inter alia, a wavefront manipulation system WFM, which is configured to modify the wavefront of the projection radiation travelling from the object plane OS to the image plane IS in a controllable manner within the meaning of the optical effect of the wavefront manipulation system being able to be variably adjusted by way of control signals of an operating control system. The wavefront manipulation system of the exemplary embodiment has a manipulator MAN having a manipulator element ME, which is arranged in the projection beam path in the direct vicinity of the object plane of the projection lens and which has a manipulator surface MS arranged in the projection beam path, the surface form and/or the refractive index distribution of which can be reversibly modified with the aid of an actuating device DR.

Figure 2:
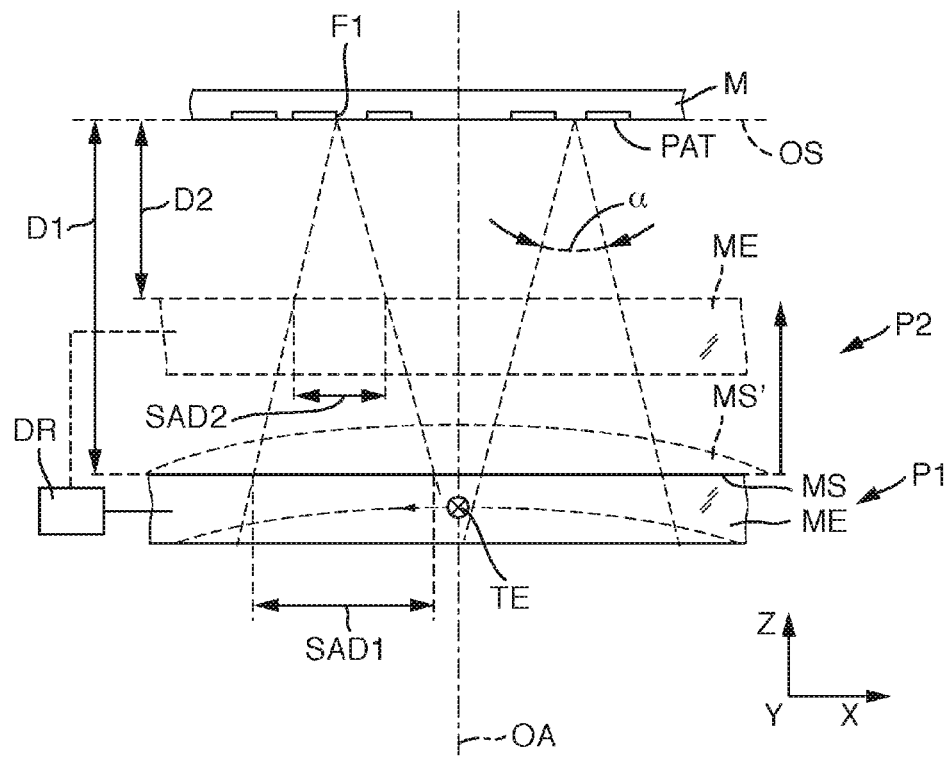
FIG. 2 shows a schematic longitudinal section in an xz-plane in the region of the mask and an immediately following manipulator element.

For further explanations, FIG. 2 shows a schematic longitudinal section in an xz-plane in the region of the mask M and the immediately following manipulator element ME. The manipulator element ME is a plate-shaped optical element made of a material transparent to the projection radiation, for example synthetic fused silica. A light-entrance side facing the object plane OS serves as a manipulator surface MS; the opposite light emergence surface extends substantially parallel to the manipulator surface.

The actuating device includes a multiplicity of actuators (not depicted here), which are actuatable independently of one another and contact the plate-shaped manipulator element ME in such a way that the surface form of the manipulator surface MS can be modified by an elastic deformation of the manipulator element. A curved profile is adjusted in the x-direction in the exemplary case. In FIG. 2, the deformed state is depicted with a curved manipulator surface MS' using dashed lines.

The manipulator element ME is movably borne relative to the frame arrangement of the projection lens via a bearing device MT. In the exemplary case, the bearing device permits a continuous global shift of the manipulator element parallel to the extent of the optical axis OA at the location of the manipulator element (z-shift) and, alternatively or additionally, a continuous tilt of the manipulator element about a tilt axis TE extending perpendicular to the optical axis. These displacements or changes in position are possible independently of the deformations caused by the actuating device.

These displacements (z-shift and/or tilt) can be initiated during the operation of the projection exposure apparatus by way of the operating control system, without intervention by an operator. To this end, provision is made for a position changing device PC, which is configured to displace the manipulator element as a whole from the first position P1 to the second position P2 (or a third, fourth, etc. position) in relation to the closest field plane (object plane OS) in a manner dependent on control signals of the operating control system. Using this, the distance from the manipulator surface to the object plane OS or to the pattern of the mask M can be modified globally (i.e. the same for all field points) or locally differently (i.e. in a field-dependent manner or differently for different field points).

The obtainable changes in the distance preferably lie at 10 μm or more. By way of example, they can lie in the range from 10 μm to 100 μm, possibly even more. In general, a positioning accuracy of the position changing device of the order of 1 μm is sufficient.

Provision can be made of devices for detecting the position for the manipulator element and/or for the reticle. By way of example, the reticle position can be determined on the basis of a measurement of the imaging effect of the lens. It is also possible for the reticle position to be monitored relative to the projection lens with the aid of at least one dedicated sensor. In order to determine the position of the near-field manipulator element ME, provision can be made of e.g. a sensor which measures the distance of a reference position on the manipulator element or the frame of the manipulator element relative to a reference position on the reticle or the reticle holder. In order to minimize the effect of a sensor drift over relatively large time intervals, the distance can be measured by way of a measurement of the imaging effect, e.g. in the case of a previously determined, fully deflected profile. By way of example, such a calibration is possible within the scope of a lens setup.

Figure 3:
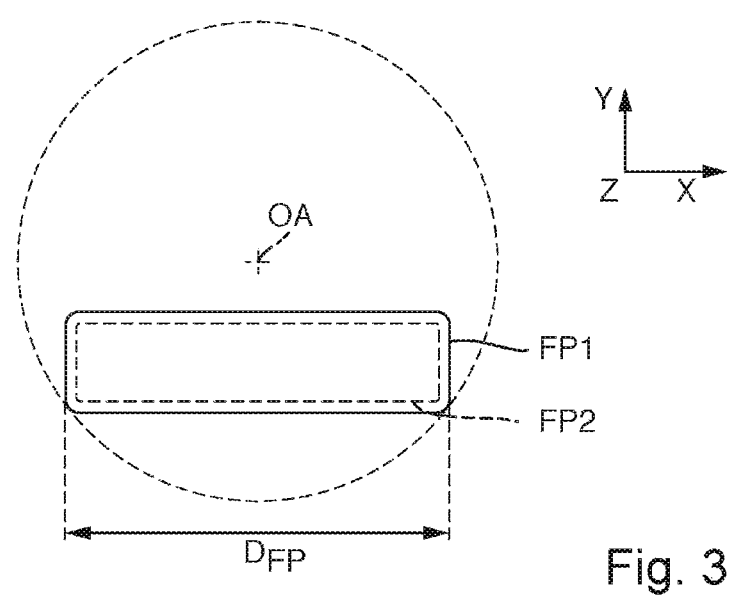
FIG. 3 shows a plan view of the manipulator element in FIG. 2, parallel to the optical axis.

As seen optically, the manipulator surface MS is arranged in the direct vicinity of the object plane OS, i.e. in a "near-field position", both in the first position P1 and in the second position P2, independently of the position changes obtainable by the position changing device. This is identifiable from, inter alia, FIG. 3. FIG. 3 shows a plan view of the manipulator surface MS or the first manipulator element ME parallel to the optical axis OA (in the z-direction). In this case, the rectangular region FP1 with rounded edges, which is depicted via a solid line, represents that region of the manipulator surface illuminated by the rays coming from the effective object field OF when the manipulator element is situated in the first position. The region is also referred to as first "footprint".

Here, the footprint of the projection radiation represents the size and shape of the intersection between the projection beam and the surface through which the projection beam passes (in this case the manipulator surface MS). The optical vicinity to the object plane OS is identifiable by virtue of the footprint substantially having the rectangular form of the object field OF, with the edge regions being slightly rounded. Moreover, the footprint lies away from the optical axis OA, just like the object field. While the optical region used by the projection radiation substantially has the form of the illuminated field region in the optical vicinity of the field, a substantially circular region is illuminated in the region of the pupil plane Fourier transformed to a field plane such that a footprint in the region of a pupil has at least approximately circular form. The region illuminated at the manipulator surface MS has an effective diameter $D_{FP}$ in the x-direction (in the first position).

If the manipulator element is displaced from the first to the second position, there is also a change in the size of the footprint. The smaller second footprint FP2, shown using dashed lines, emerges in the second position P2, which lies closer to the object plane.

In the case of a projection lens, a beam emanates from each field point of the object plane, the diameter of which beam increases with increasing distance from the object plane. The object-side numerical aperture $NA_O$ in this case corresponds to the sign of the aperture angle α of each beam. Each beam emanating from a field point illuminates a circular subaperture at the manipulator surface MS, the diameter of which subaperture being denoted as subaperture diameter SAD. It is immediately possible to see from FIG. 2 that the subaperture diameter SAD increases with increasing distance from the object plane and with increasing image-side numerical aperture. The manipulator is arranged so close to the object plane that a plurality of subapertures fit next to one another in the illuminated region FP without mutual overlap in the x-direction. Preferably, the condition $SAD/D_{FP} < 0.2$ should be satisfied, in particular even the condition $SAD/D_{FP} < 0.1$.

If these conditions are observed, it is possible, for example, to influence distortion in the image field of the projection lens in a location-dependent manner with the aid of the controllable manipulator in such a way that a field-dependent distortion correction becomes possible. This is achieved by virtue of the manipulator being able to introduce different changes in the optical path length for beams emanating from different field points. The change in the optical path length is also referred to as optical path length change.

The manipulator can also be used for correcting the field curvature.

The local distribution of the optical path length changes in the x-direction is changeable by actuating the actuating devices of the manipulator in such a way that it is possible to adjust the field dependence of the wavefront correction. The form and magnitude of the wavefront change in this case depend on the profile of the optical path length change by way of the manipulator surface MS within the subaperture belonging to the beam.

Subaperture diameters of different sizes emerge in a manner dependent on the (axial) position of the manipulator element (and/or on the tilt angle) as a result of the option of changing the position of the manipulator element relative to the object plane. In the example of FIG. 2, a first beam emanates from the first field point F1, the beam generating a first subaperture diameter SAD1 at the manipulator surface MS when the manipulator element is situated in the first position (further away from the object plane). If the manipulator element is displaced into the second position P2 closer to the object plane by way of an axial shift, a second subaperture diameter SAD2 emerges at the manipulator surface for the same beam, the second subaperture diameter being significantly smaller than the first subaperture diameter SAD1. As a result of the optical vicinity to a field plane, there therefore is a relatively strong change in the subaperture dimension (which is e.g. quantifiable by way of the subaperture diameter).

Within the scope of this application, a relative change in the subaperture dimension of 1% or more is considered to be a strong change, the optical effect of which can be used in a targeted manner.

In the schematic illustration of FIG. 2, the pattern PAT of the mask M is situated exactly in the object plane OS of the projection lens within the scope of the adjustment possibilities. There can be various reasons for deviating from this mask position. By way of example, provision can be made within the scope of the first adjustment for the reticle to be positioned in such a way that the pattern remains systematically outside of the object plane, for example at a greater distance from the projection lens. In the case of a first adjustment, the mask (the reticle) may be shifted e.g. only in relation to the nominal object plane but not in relation to the optimum object plane. By way of example, this adjustment in the position can be undertaken in order to compensate image aberrations due to manufacturing and assembly tolerances. This also means a change in the position of the reticle relative to a near-field manipulator element (e.g. a transparent plate) assembled with a fixed distance at the projection lens. Spacers of the z-position of a plane plate can also be considered to be a special case of a position-shifting manipulator during the first adjustment.

It is also possible for the optimum position of the mask or the pattern in relation to the object plane to change over the service life of the projection exposure apparatus, e.g. as a result of thermal effects (cue: lens heating), and so the mask should be arranged systematically outside of the object plane in order to achieve the sought-after imaging quality. After changing a reticle it is also possible for the position of the pattern to deviate in relation to the object plane from a position predefined earlier.

Figure 4:
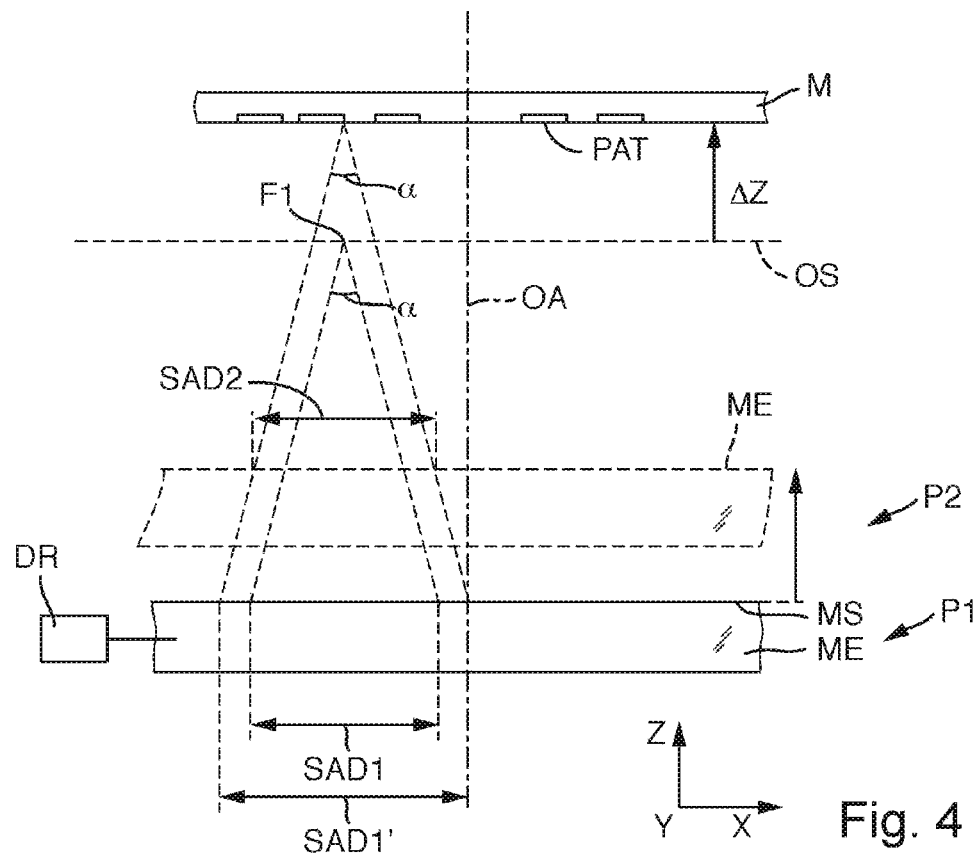
FIG. 4 schematically shows effects of a global displacement parallel to the optical axis of the mask in relation to the object plane in the region of a manipulator element arranged in a near-field manner.

The schematic FIG. 4 is used to explain what effects a global displacement of the reticle or of the mask M in relation to the object plane OS in the z-direction, i.e. parallel to the optical axis OA, can have in the region of a manipulator element ME arranged in a near-field manner. Analogous to FIG. 2, the plate-shaped manipulator element ME is initially in a first position P1, which corresponds to the first position P1 in FIG. 2 and, for example, which can be considered to be a reference position. Analogous to the situation in FIG. 2, a beam emanating from a field point F1 would generate a subaperture with a first subaperture diameter SAD1 at the manipulator surface MS in the case of the same object-side numerical aperture and a corresponding aperture angle α. However, the mask is not arranged in such a way that the pattern PAT lies directly in the object plane OS; instead, it lies away from the object plane at a larger distance from the manipulator element ME. More precisely, the mask is displaced in relation to the object plane OS by an absolute value of the displacement ΔZ parallel to the z-direction. Here, this is also referred to as z-decentring. In the case of otherwise unchanged imaging conditions, the beam emanating from the position of the pattern PAT corresponding to the field point F1 will illuminate a larger subaperture with a larger subaperture diameter SAD1' at the manipulator surface MS. Here, the extent of the magnification of the subaperture diameter depends linearly on the absolute value of the z-decentring.

An example for typical orders of magnitude in the case of object-side high aperture projection lenses: in the case of a manipulator element in the form of a near-field plate with a distance of 3 mm from the reticle (mask) and a reticle shift of 100 μm in the z-direction, the relative change in the subaperture dimension can be several percent, e.g. approximately 3%.

If the manipulator element ME is deformed for correcting the wavefront such that, for example, the surface form of the manipulator surface MS changes in the region of the subaperture, it is clear that the beam illuminates a different section of the deformed surface in the case of a smaller distance between the image-generating mask and the manipulator surface than in the case of a larger distance (which includes the subaperture diameter SAD1'). Accordingly, there is also a different optical effect of the activated manipulator element on the projection radiation passing through and a different field dependence of this optical effect if the pattern PAT is not arranged directly in the object plane OS but displaced outside thereof, for example in the z-direction. Accordingly, a predetermined manipulated value change at the manipulator element will generally have different effects on the projection radiation depending on the distance at which the image-generating mask is arranged from the manipulator element. In other words: the sensitivity of the manipulator can have a significant change in the case of a displacement of the mask relative to the object plane.

With the aid of the option of displacing the manipulator element ME from the first position P1 into the second position P2 via a shift in the z-direction, as explained with the aid of FIG. 2, it is possible to at least partly compensate this change in the sensitivity of the manipulator. This becomes vividly clear from FIG. 4. If the manipulator element ME is shifted into the second position P2 in the direction of the mask or the object plane, the shift path (arrow) can be adapted in such a way that, after this shift, the subaperture at the manipulator surface MS belonging to the beam at F1 has a second subaperture diameter SAD2 which substantially corresponds to the subaperture diameter SAD1.

As a result, what can be achieved to a first approximation by the z-shift of the manipulator element ME from the first position into the second position is that the sensitivity of the manipulator for the situation shown in FIG. 4, where a mask is displaced from the object plane OS in the z-direction, substantially corresponds to the sensitivity which the manipulator has for the corresponding deformation when the manipulator element ME is situated in the first position P1 and the mask is situated in the reference position thereof, in which the pattern PAT substantially coincides with the object plane OS.

Therefore, the manipulator with the manipulator element ME arranged in a near-field manner and displaceable in the z-direction functions as a functional component of a sensitivity adaptation system which is able to adapt the sensitivity of the manipulator to changes of the imaging properties by a displacement of the mask in relation to the object plane.

Changes in the sensitivity can also emerge in the case of a tilt of the manipulator element. Here, the tilting of the plate alone can already generate an optical effect. Then, it may no longer be sufficient simply to tilt the plate in accordance with a tilt of the reticle. Rather, provision can be made for the tilt effect of the plate to be compensated additionally by using other manipulators.

Figure 5:
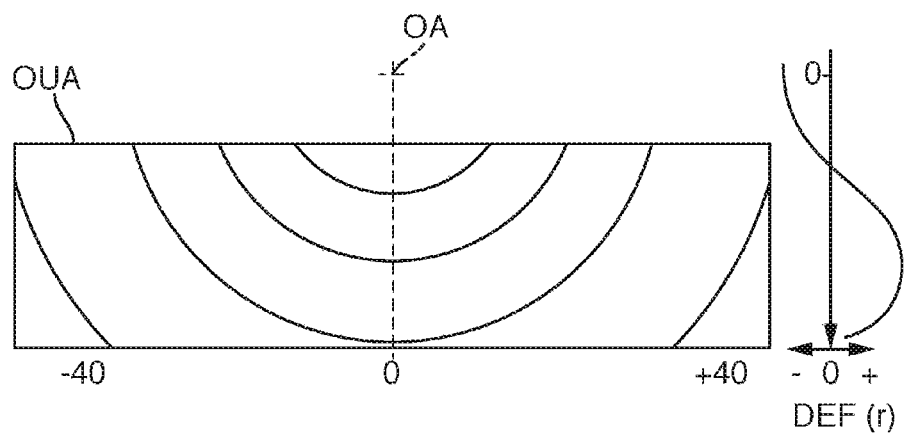
FIG. 5 schematically shows a plan view of the illuminated region of a rotationally symmetrically deformed plane plate.

Below, a specific exemplary embodiment is explained in more detail on the basis of FIGS. 5 to 7 and Table 1. In the exemplary case, the manipulator element is a plane-parallel plate transparent to the projection radiation, which can be deformed via a plurality of actuators arranged at the edge. In the exemplary case of FIG. 5, the plate is deformed in a rotationally symmetric manner in relation to the optical axis (e.g. in accordance with Zernike Z9). FIG. 5 only shows the rectangular optically used region OUA. The centre of the spherical deformation lies outside of the optical used region on the optical axis OA. The circular arc-shaped lines represent lines with the same amplitude of the deformation, i.e. lines with the same displacement in the z-direction (parallel to the optical axis) from the neutral position which is assumed in the case of a non-deformed plane plate. The diagram at the right-hand edge of FIG. 5 illustrates the radial profile DEF(r) of the deformation. In the exemplary case, there is a deformation of approximately −40 nm from the neutral position at the location of the optical axis and a deformation of approximately +25 nm in the opposite direction at the ring of maximum positive deformation. Smaller maximum amplitudes or significantly larger maximum amplitudes (e.g. several hundred nanometres) may also occur.

This rotationally symmetric deformation is only one exemplary degree of freedom of this manipulator. Other forms of deformations are possible, e.g. cylindrical deformations, wave-shaped deformations, saddle-shaped deformations, etc.

FIGS. 6A-6B and 7A-7B depict the effects of the manipulator as a function of the position of the manipulator element in relation to the closest field plane (reticle plane). The field points in the x-direction are specified on the x-axis in each one of the diagrams. The y-axis specifies quantitative values for selected Zernike coefficients. Here, FIGS. 6A and 7A each show values for the effect on the distortion in the x-direction (specified by Zernike coefficient Z2, in [nm]) and FIGS. 6B and 7B each show the effect on the distortion in the y-direction (specified by Zernike coefficient Z3, in [nm]). FIGS. 6A-6B shows the conditions in the case of a distance D of 3 mm between the object plane of the projection lens and the manipulator surface MS; the distance is double that, i.e. 6 mm, in the case of FIGS. 7A-7B.

The solid curves in each case represent the optical effect of the manipulator in the case of a travel A, while the dashed lines represent the optical effect in the case of a travel twice as large, namely 2A. If the travel is increased, the radius of curvature of the spherical deformation is reduced, i.e. a stronger deformation is adjusted.

Tables 1 and 2 specify the values of the Zernike coefficients Z2 [nm] and Z3 [nm] belonging to the diagrams, for a travel A (@ A) and for a travel twice as large 2*A (@ 2*A) for the field points FP1, FP2, etc. in the x-direction (FP in x) for the first position (Table 1) and for the second position (Table 2).

TABLE 1

Manipulator element at position 1

| FP in x | FP1 | FP2 | FP3 | FP4 | FP5 | FP6 | FP7 | FP8 | FP9 | FP10 | FP11 | FP12 | FP13 |
|---|---|---|---|---|---|---|---|---|---|---|---|---|---|
| Z2 @ A | 2.10 | 0.48 | −0.45 | −0.82 | −0.78 | −0.46 | 0.00 | 0.46 | 0.78 | 0.82 | 0.45 | −0.48 | −2.10 |
| Z3 @ A | −1.08 | −0.32 | 0.30 | 0.79 | 1.14 | 1.34 | 1.41 | 1.34 | 1.14 | 0.79 | 0.30 | −0.32 | −1.08 |
| Z2 @ 2*A | 4.20 | 0.95 | −0.90 | −1.65 | −1.56 | −0.92 | 0.00 | 0.92 | 1.56 | 1.65 | 0.90 | −0.95 | −4.20 |
| Z3 @ 2*A | −2.16 | −0.64 | 0.61 | 1.58 | 2.27 | 2.69 | 2.83 | 2.69 | 2.27 | 1.58 | 0.61 | −0.64 | −2.16 |

TABLE 2

Manipulator element at position 2

| FP in x | FP1 | FP2 | FP3 | FP4 | FP5 | FP6 | FP7 | FP8 | FP9 | FP10 | FP11 | FP12 | FP13 |
|---|---|---|---|---|---|---|---|---|---|---|---|---|---|
| Z2 @ A | 4.21 | 0.96 | −0.90 | −1.64 | −1.56 | −0.92 | 0.00 | 0.92 | 1.56 | 1.64 | 0.90 | −0.96 | −4.21 |
| Z3 @ A | −2.17 | −0.64 | 0.60 | 1.57 | 2.27 | 2.68 | 2.82 | 2.68 | 2.27 | 1.57 | 0.60 | −0.64 | −2.17 |
| Z2 @ 2*A | 8.42 | 1.92 | −1.79 | −3.29 | −3.12 | −1.84 | 0.00 | 1.84 | 3.12 | 3.29 | 1.79 | −1.92 | −8.42 |
| Z3 @ 2*A | −4.34 | −1.29 | 1.21 | 3.15 | 4.53 | 5.37 | 5.64 | 5.37 | 4.53 | 3.15 | 1.21 | −1.29 | −4.34 |

The relatively large change in position (approximately 3 mm) between the first and the second position depicted here is selected for the purpose of the example in order to illustrate the functional principle. In practice, substantially smaller changes in distance will generally be sufficient, for example of the order of between 10 µm and 100 µm.

Each one of the individual images shows that the manipulator in each case has a linear effect for a fixed position in such a way that the influence of the wavefront doubles if the travel doubles. Therefore, the manipulator satisfies the linearity hypothesis at each position.

However, the comparison of FIGS. 6 and 7 also shows that the absolute optical effect of the manipulator changes significantly with the change in the position of the manipulator. It is possible to see that, in the case of a larger distance (6 mm instead of 3 mm), the same travels (A and 2A) lead to a stronger influence in absolute terms on the wavefront of the passing-through projection beam.

Therefore, it is possible to see that a change in the axial position of the manipulator element in relation to the closest object plane (as a result of a displacement parallel to the optical axis) leads to a change in the sensitivity of the manipulator. Within the scope of the sensitivity adaptation system, this can be used to adapt the sensitivity of the manipulator to changes of imaging properties which, for example, may be caused by displacing the mask in relation to the object plane and/or by deforming the mask.

Below, an example is used to explain an embodiment in which different sensitivities are assigned to a manipulator, between which sensitivities the operating control system can select in a targeted manner depending on set operating conditions of the projection lens. As already mentioned above, the term "sensitivity" within the scope of this application denotes a relationship between a defined manipulated value change at the manipulator and the effect on the imaging property of the projection lens obtained by the change in manipulated value. This relationship is known with a sufficient precision within a certain manipulated value range due to measurements and/or calculations. In this exemplary embodiment, sensitivities are stored electronically in a storage, accessible to the operating control system, in the form of suitable data structures—so-called "sensitivity tables". FIG. 8 is a schematic graphic illustration of an example of a sensitivity table TAB. This table describes, in the case of an adjustable manipulator, what effect a manipulated value change SW of 1 µm (SW=1 µm) has on the Zernike coefficients Z2, Z3, Z4, etc. for different field points FP of a field to be considered, which Zernike coefficients are used in the exemplary case to parameterize the imaging property of the projection lens. Here, the manipulated value change of 1 µm causes a change in the Z2 coefficient by a value of $Z2_{11}$ for a field point with an x-coordinate $X_1$ and a y-coordinate $Y_1$. The same manipulated value change generates a change in the Z2 coefficient by a value of $Z2_{12}$ for an adjacent field point with the same x-coordinate $X_1$ and a different y-coordinate $Y_2$. According to the same scheme, the associated changes in the case of a manipulated value change of 1 µm of the manipulator are detected and stored in the sensitivity table for a multiplicity of field points (for example between 5 field points and 100 field points) of the field for all aberrations or Zernike coefficients of interest.

In general, a sensitivity table is only valid for a specific manipulated value range (validity range). In one exemplary embodiment, the admissible manipulated value range is defined in such a way that the manipulator exhibits a linear behaviour within the manipulated value range with sufficient accuracy in such a way that this results approximately in a proportionality between the magnitude of the current manipulated value change and the magnitude of the wavefront change caused thereby. Accordingly, in the manipulated value range valid for the sensitivity table TAB, a manipulated value change of 2 µm brings about changes in the Zernike coefficients substantially twice as large as a manipulated value change of 1 µm. Therefore, a sensitivity table is only valid in each case for a defined manipulated value range in which a linear behaviour can be assumed with sufficient accuracy.

An exactly linear behaviour of the manipulator within the manipulated value range is not required. Small deviations from mathematically exact linearity are admissible. In accordance with an embodiment usually suitable in practice, a manipulator with one degree of freedom is, in particular, considered to be linear in this degree of freedom within the scope of this application if the following applies: If the travel prescription is doubled, the RMS (root mean square) of the wavefront aberration induced thereby deviates by at most 1%, in particular by at most 0.1%, from twice the RMS of the wavefront aberration induced in the case of a single travel prescription.

As explained above in conjunction with FIGS. 2 to 4, there are principle-based limits for the validity of a linearity hypothesis for manipulator elements arranged optically in the vicinity of the closest field plane because relatively small changes in position may already lead to relatively large changes in the subaperture dimensions and hence to relatively large changes in the optical effect which is dependent on the field point considered. These circumstances are taken into account in exemplary embodiments by virtue of the fact that stored in the storage of the operating control system there is a sensitivity series with two or more different sensitivities of the manipulator for different, mutually adjoining manipulated value ranges which are defined by thresholds (limit values). In this manner, it is possible to assign different sensitivities to the manipulator depending on operating conditions by virtue of the sensitivity or sensitivity table best suited to the respective operating condition being selected from the sensitivity series.

Figure 9:
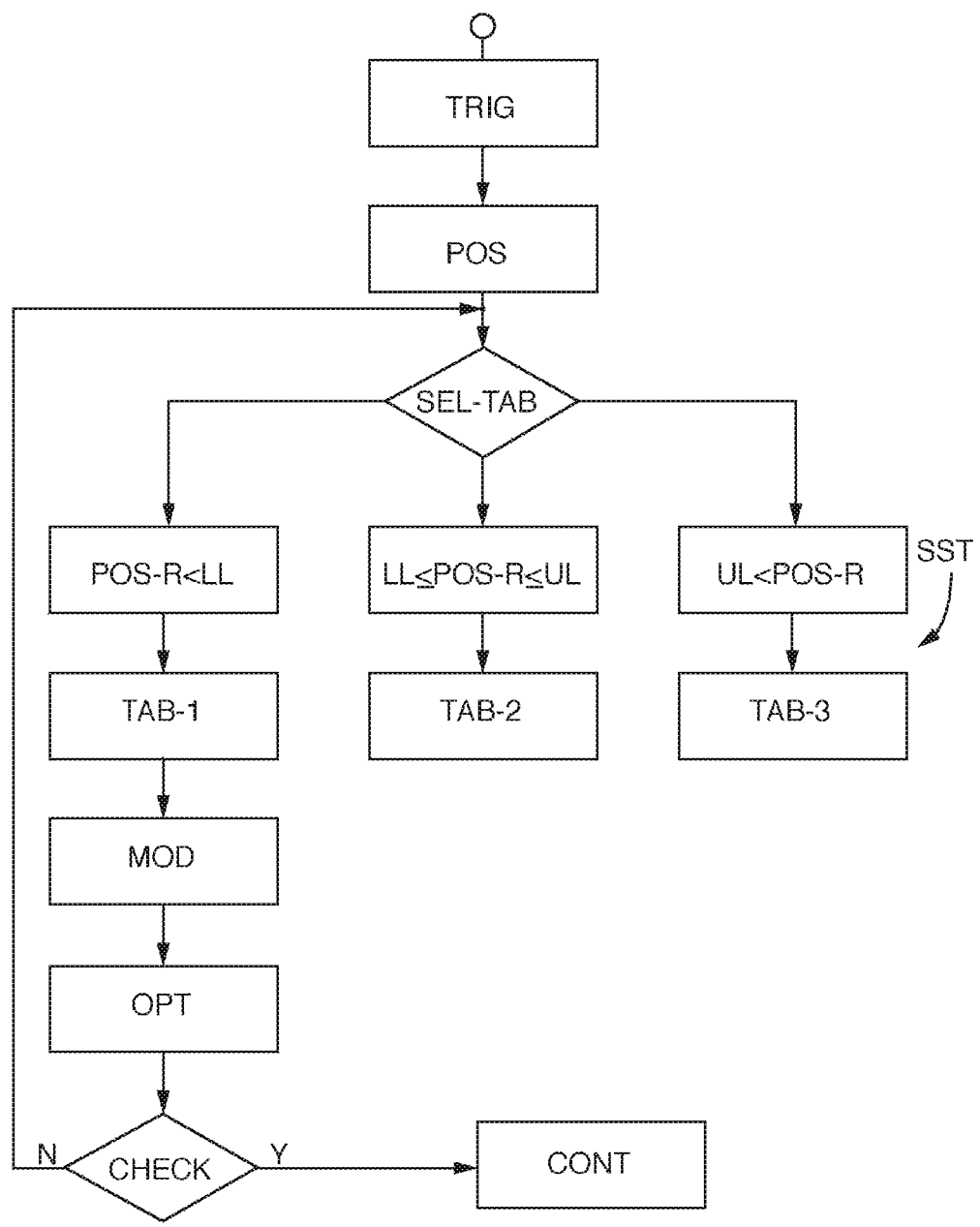
FIG. 9 shows an example for the operation of a projection exposure apparatus, in which the operating control system, in a manner dependent on the position of the reticle, in each case automatically selects the best fitting sensitivity of a manipulator for the current position from a multiplicity of sensitivities of a sensitivity series.

FIG. 9 is now used to explain an example for the operation of a projection exposure apparatus, in which the operating control system, in a manner dependent on the position of the reticle (the mask), in each case automatically selects the best fitting sensitivity of a manipulator for the current situation from a multiplicity of sensitivities of a sensitivity series SST.

In the exemplary case, the mask (the reticle) can be displaced parallel to the optical axis (in the z-direction) in relation to the object plane of the projection lens with the aid of the lifting device of the reticle stage RS. The z-position (axial position) of the reticle is represented by the parameter POS-R. In the exemplary case, three different sensitivity tables (first sensitivity table TAB-1, second sensitivity table TAB-2 and third sensitivity table TAB-3) are stored in the storage of the operating control system, the sensitivity tables covering three directly adjacent position ranges of the reticle. If the reticle position POS-R lies in the range from a lower threshold LL to an upper threshold UL, the relationship between a defined manipulated value change and the effect on the imaging properties is represented sufficiently accurately by the second sensitivity table TAB-2. There are significant deviations from an approximately linear behaviour at positions below the lower threshold (POS-R<LL) or positions above the upper threshold (POS-R>UL), and so one of the other sensitivity tables should in each case be used as a basis here.

The control should then be based on the first sensitivity table TAB-1 when the reticle position lies below the lower threshold from table TAB-2 (POS-R<LL). If the reticle position POS-R lies above the upper threshold UL, the control should be carried out on the basis of the third sensitivity table TAB-3.

A routine for checking and possibly changing the control algorithm on the basis of sensitivities is triggered in the exemplary case by a trigger step TRIG, which contains a new aberration measurement with the aid of an integrated wavefront measurement system in the exemplary case. Using this, data which represent the current imaging property of the projection lens are generated.

Data representing the current position of the reticle are generated in a subsequent position detection step POS. By way of example, it is possible to query data from (one or more) corresponding reticle position sensors to this end.

Optionally, it is additionally possible to detect the positions of (one or more) possibly present further manipulator elements and these can subsequently be taken into account. The selection of a sensitivity table fitting to the corresponding reticle position is carried out in a subsequent selection step SEL-TAB. The suitable sensitivity for the manipulator is called from the storage in a manner dependent on the reticle position. If the position detection step yields that the position of the reticle lies between the lower threshold LL and the upper threshold UL of the second sensitivity table TAB-2, this second sensitivity table is used as a basis for the further control. If the reticle position lies above the upper threshold (UL<POS-R), the third sensitivity table TAB-3 is used as a basis for subsequently continuing.

However, in the exemplary case, the position of the reticle should lie below the lower threshold LL of the second sensitivity table, i.e. the condition POS-R<LL should be satisfied. In this case, a model is calculated in a subsequent modelling step MOD which uses the imaging properties of the projection lens using the sensitivities of the first sensitivity table TAB-1. To this end, the corresponding sensitivities and other parameters are loaded for optimization purposes.

There is an optimization of the model in a subsequent optimization step OPT. The optimization step yields, inter alia, possible travel changes of all manipulators which should be used for adapting the imaging behaviour.

In a subsequent checking step CHECK, the reticle travel possibly modified by the optimization step (i.e. the manipulated value change) is monitored. Here, a check is carried out as to whether the reticle position POS-R including the optimization step OPT is still situated in the validity range of the first sensitivity table TAB-1. In order to prevent the optimizer from entering an endless loop when the validity range is exceeded slightly, a threshold for the magnitude of the transgression can be used in the checking step, the latter acting in such a way that a new optimization with a newly selected sensitivity table is only carried out after the threshold is exceeded.

If the optimization has led to the reticle position lying outside of the validity range of the first sensitivity table TAB-1, the procedure is continued with a new selection step SEL-TAB for selecting a fitting sensitivity table. By contrast, if the checking step CHECK shows that the reticle position including the optimization step still lies within the validity range of the first sensitivity table TAB-1, the control of the projection lens by the operating control system continues to be based on the first sensitivities of the first sensitivity table TAB-1 by virtue of the control algorithm being modified accordingly.

In the exemplary case of FIG. 8, the process is triggered by an aberration measurement. It is also possible to carry out a check and, if need be, a correction of the control algorithm on the basis of a feed-forward model at times fixedly predetermined in advance.

In the exemplary case, the reticle position is registered on the basis of sensor data which represent the reticle position. In principle, it is also possible to operate without a sensor-based position registration, for example by virtue of travels of a reticle manipulator being added.

In the exemplary case, three sensitivity tables are provided for illustrative purposes. In some cases, it may be sufficient only to provide two different sensitivity tables in a sensitivity series. It is also possible to have more than three different sensitivity tables in a sensitivity series, e.g. four, five, six or more.

In the case of variants with two or more different sensitivity tables, provision can be made for at least one further, derived sensitivity table to be calculated via a calculation algorithm on the basis of at least two different, already available sensitivity tables (initial sensitivity tables) and for a manipulator to be controlled using the derived sensitivity table. The values of the derived sensitivity table can be calculated e.g. by interpolation from values of the initial sensitivity tables. In this way, it may be possible to establish a sensitivity better suited to current conditions (e.g. a current reticle position) and thereby obtain a once again improved effect of a manipulator.

The exemplary embodiments were explained on the basis of a manipulator which has a deformable plane plate as a manipulator element. The disclosure is not restricted thereto. By way of example, a manipulator element can be embodied as a multi-part manipulator element with a liquid-filled interstice in accordance with the patent document U.S. Pat. No. 7,990,622 B2.

Some aspects of exemplary embodiments were explained on the basis of systems with an off-axis field. From a technical point of view, an off-axis field is not required. Near-field manipulators of the type described here can likewise be used in on-axis systems with corresponding advantages.

The phrasing of all claims is made part of the content of the description by reference.

What is claimed is:

1. A projection lens configured to image a pattern in an object plane of the projection lens into an image plane of the projection lens via electromagnetic radiation with a work wavelength less than 260 nm, the projection lens comprising:
    a multiplicity of optical elements with optical surfaces in a projection beam path between the object plane and the image plane so that the pattern arranged in the object plane is imageable in the image plane via the optical elements;
    a wavefront manipulation system configured to controllably influence a wavefront of the electromagnetic radiation travelling from the object plane to the image plane; and
    a sensitivity adaptation system,
    wherein:
        the wavefront manipulation system comprises a manipulator comprising a manipulator element in the projection beam path;
        the wavefront manipulation system comprises an actuating device configured to reversibly change an optical effect of the manipulator element on the electromagnetic radiation in the projection beam path;
        a manipulator surface of the manipulator element is arranged at a finite distance from a closest field plane of the projection lens in an optical vicinity of the closest field plane so that locally different optical effects of the manipulator element are adjustable via the actuating device for beams emanating from different field points of the field plane;
        the sensitivity adaptation system is configured to adapt a sensitivity of the manipulator to changes of imaging properties by displacing the mask in relation to the object plane and/or by deforming the mask;
        an operating control system is assignable to the projection lens;
        the operating control system is configured so that the manipulator is controlled on the basis of a control algorithm;
        a sensitivity series comprises two or more different sensitivities of the manipulator for different, mutually adjoining manipulated value ranges defined by thresholds is stored in a storage of the operating control system;
        a sensitivity describes a relationship between a defined manipulated value change at the manipulator and the effect, obtained thereby, on the imaging property of the projection lens within a defined manipulated value range; and
        the operating control system is configured so that, when a threshold within the sensitivity series is overshot or undershot, a switch is made from a first sensitivity to a second sensitivity differing therefrom and the control algorithm is modified thereby.

2. The projection lens of claim 1, wherein the manipulator element is movably borne via a bearing device and displaceable in a manner dependent on control signals of an operating control system from a first position to a second position in relation to the closest field plane via a position changing device.

3. The projection lens of claim 2, wherein:
    the projection lens has an optical axis, and the manipulator element is shiftable parallel to the optical axis in a region of the manipulator element via the position changing device; and/or
    the manipulator element is tiltable about a tilt axis extending across the optical axis in the region of the manipulator element via the position changing device.

4. The projection lens of claim 3, wherein a change in the distance of at least 10 μm is adjustable for at least one field point.

5. The projection lens of claim 4, wherein the closest field plane is the object plane of the projection lens, and no optical surface with refractive power is arranged between the object plane and the manipulator surface so that a numerical aperture of the electromagnetic radiation at the manipulator surface equals an object-side numerical aperture.

6. The projection lens of claim 5, wherein at least one of the following conditions holds for a position of the manipulator surface in the projection beam path:
    each beam emanating from a field point of the field plane illuminates a subaperture with a subaperture diameter at the manipulator surface, an optically used diameter of the manipulator surface has a maximum value, and a ratio of the subaperture ratio to the maximum value of the used diameter of the manipulator surface is less than 0.2;
    a distance between the manipulator surface and a closest field plane is 30 mm or less; and
    a subaperture ratio at the manipulator surface is less than 0.1.

7. The projection lens of claim 1, wherein a change in the distance of at least 10 μm is adjustable for at least one field point.

8. The projection lens of claim 1, wherein the closest field plane is the object plane of the projection lens.

9. A projection lens configured to image a pattern of a mask in an object plane of the projection lens into an image plane of the projection lens via electromagnetic radiation with a work wavelength of less than 260 nm, the projection lens comprising:
- a multiplicity of optical elements with optical surfaces which are arranged in a projection beam path between the object plane and the image plane so that the pattern in the object plane is imageable in the image plane via the optical elements; and
- a wavefront manipulation system configured to controllably influence a wavefront of the electromagnetic radiation travelling from the object plane to the image plane, wherein:
- the wavefront manipulation system comprises a manipulator comprising a manipulator element arranged in the projection beam path;
- the wavefront manipulation system comprises an actuating device configured to reversibly change an optical effect of the manipulator element on radiation of the projection beam path;
- a manipulator surface of the manipulator element is arranged at a finite distance from a closest field plane of the projection lens in an optical vicinity of the closest field plane so that locally different optical effects of the manipulator element are adjustable via the actuating device for beams emanating from different field points of the field plane;
- the manipulator element is movably borne via a bearing device and displaceable in a manner dependent on control signals of an operating control system from a first position to a second position in relation to the closest field plane via a position changing device;
- an operating control system is assignable to the projection lens;
- the operating control system is configured so that the manipulator is controlled on the basis of a control algorithm;
- a sensitivity series comprises two or more different sensitivities of the manipulator for different, mutually adjoining manipulated value ranges defined by thresholds is stored in a storage of the operating control system;
- a sensitivity describes a relationship between a defined manipulated value change at the manipulator and the effect, obtained thereby, on the imaging property of the projection lens within a defined manipulated value range; and
- the operating control system is configured so that, when a threshold within the sensitivity series is overshot or undershot, a switch is made from a first sensitivity to a second sensitivity differing therefrom and the control algorithm is modified thereby.

10. The projection lens of claim 9, wherein:
the projection lens has an optical axis, and the manipulator element is shiftable parallel to the optical axis in a region of the manipulator element via the position changing device; and/or
the manipulator element is tiltable about a tilt axis extending across the optical axis in the region of the manipulator element via the position changing device.

11. The projection lens of claim 9, wherein a change in the distance of at least 10 μm is adjustable for at least one field point.

12. The projection lens of claim 11, wherein the closest field plane is the object plane of the projection lens, and no optical surface with refractive power is arranged between the object plane and the manipulator surface so that a numerical aperture of the electromagnetic radiation at the manipulator surface equals an object-side numerical aperture.

13. The projection lens of claim 12, wherein at least one of the following conditions holds for a position of the manipulator surface in the projection beam path:
- each beam emanating from a field point of the field plane illuminates a subaperture with a subaperture diameter at the manipulator surface, an optically used diameter of the manipulator surface has a maximum value, and a ratio of the subaperture ratio to the maximum value of the used diameter of the manipulator surface is less than 0.2;
- a distance between the manipulator surface and a closest field plane is 30 mm or less; and
- a subaperture ratio at the manipulator surface is less than 0.1.

14. A method, comprising:
arranging a mask between an illumination system and a projection lens of a projection exposure apparatus so a pattern of the mask is in a region of an object plane of the projection lens;
arranging a substrate so that a radiation-sensitive surface of the substrate is arranged in a region of an image plane of the projection lens optically conjugate to the object plane;
illuminating an illumination region of the mask with illumination radiation having a work wavelength less than 260 nm;
projecting part of the pattern onto an image field on the substrate via the projection lens, all rays of electromagnetic radiation contributing to the image generation in the image field form a projection beam path;
influencing a wavefront of the electromagnetic radiation travelling from the object plane to the image plane by actuating a manipulator comprising a manipulator surface arranged in the projection beam path and an actuating device for reversibly changing surface form and/or refractive index distribution of the manipulator surface, the manipulator surface of the manipulator element being arranged at a finite distance from a closest field plane of the projection lens in an optical vicinity of the closest field plane so that locally different optical effects of the manipulator element are adjustable via the actuating device for beams emanating from different field points of the field plane;
displacing the mask in relation to the object plane and/or deforming the mask; and
adapting a sensitivity of the manipulator to changes of imaging properties caused by displacing the mask in relation to the object plane and/or by deforming the mask, wherein:
a sensitivity series is stored in a storage of an operating control system assigned to the projection lens
the sensitivity series with comprises or more different sensitivities of the manipulator for different, mutually adjoining manipulated value ranges which are defined by thresholds;
a sensitivity describes a relationship between a defined manipulated value change on the manipulator and the effect, obtained thereby, on the imaging quality of the projection exposure apparatus within a defined manipulated value range; and when a threshold within the sensitivity series is overshot or undershot, a switch is made from a first sensitivity to a second sensitivity differing therefrom and the control algorithm is modified thereby.

15. The method of claim 14, wherein the manipulator element is displaced, in a manner dependent on control signals of an operating control system, from a first position to a second position in relation to the closest field plane for the purposes of adapting the sensitivity of the manipulator.

16. The method of claim 15, wherein the projection exposure apparatus comprises a central controller to control functions of the projection exposure apparatus, wherein a control module for actuating the wavefront manipulation system is assigned to the control device and the manipulator is actuatable in accord with other control signals during the operation of the projection exposure apparatus by way of the control module.

17. The method of claim 16, wherein the projection exposure apparatus comprises a device to holding the mask, and the device comprises an integrated lifting device for a linear displacement of the mask in a displacement direction perpendicular to the object plane and/or an integrated tilting device for tilting the mask about a tilt axis extending perpendicular to the displacement direction.

18. The method of claim 15, wherein the projection exposure apparatus comprises a device to holding the mask, and the device comprises an integrated lifting device for a linear displacement of the mask in a displacement direction perpendicular to the object plane and/or an integrated tilting device for tilting the mask about a tilt axis extending perpendicular to the displacement direction.

* * * * *

UNITED STATES PATENT AND TRADEMARK OFFICE
CERTIFICATE OF CORRECTION

PATENT NO. : 10,061,206 B2
APPLICATION NO. : 15/814765
DATED : August 28, 2018
INVENTOR(S) : Boris Bittner et al.

Page 1 of 1

It is certified that error appears in the above-identified patent and that said Letters Patent is hereby corrected as shown below:

In the Specification

Column 3, Line 13, delete "f" and insert -- of --.

In the Claims

Column 24, Line 59, in Claim 14, delete "with" and insert -- which --.

Signed and Sealed this
Ninth Day of April, 2019

Andrei Iancu
*Director of the United States Patent and Trademark Office*